(12) United States Patent
Yoshioka

(10) Patent No.: US 6,337,582 B1
(45) Date of Patent: Jan. 8, 2002

(54) BUFFER CIRCUIT

(75) Inventor: Syuhei Yoshioka, Kanagawa (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/691,460

(22) Filed: Oct. 18, 2000

(30) Foreign Application Priority Data

Oct. 18, 1999 (JP) .......................................... 11-295556

(51) Int. Cl.$^7$ .............................. G11C 7/00; G11C 8/00
(52) U.S. Cl. .................... 326/83; 326/113; 365/189.05; 365/230.06
(58) Field of Search ............................. 326/83, 95, 98, 326/113; 365/230.06, 233, 189.05

(56) References Cited

U.S. PATENT DOCUMENTS

| 5,325,328 A | * | 6/1994 | Muroya et al. | ......... 365/189.05 |
| 5,680,366 A | * | 10/1997 | Kotani et al. | .......... 365/230.06 |
| 5,867,449 A | * | 2/1999 | Casper | ..................... 365/233.5 |

* cited by examiner

*Primary Examiner*—Michael Tokar
*Assistant Examiner*—Daniel D. Chang
(74) *Attorney, Agent, or Firm*—Rosenman & Colin LLP

(57) ABSTRACT

A buffer circuit is provided, which suppresses the fluctuation or deviation of the power supply voltage and the ground voltage that are caused by the logic state change of an address signal applied thereto. The buffer circuit comprises (a) a first inverter circuit having the CMOS configuration; (b) a second inverter circuit having the CMOS configuration; and (c) an equalization circuit for equalizing the first output signal of the first inverter circuit and the second output signal of the second inverter circuit. Each of the first and second inverter circuits is activated or inactivated by a control signal. When the first and second inverter circuits are activated, the equalization circuit is set in the high-impedance state, in which the first inverter circuit generates a first output signal at its output terminal and the second inverter circuit generates a second output signal at its output terminal. When the first and second inverter circuits are inactivated, the equalization circuit is set in the low-impedance state, in which the output terminals of the first and second inverter circuits is connected to each other by way of the equalization circuit, resulting in the first and second output signals of the first and second inverter circuits being in an approximately intermediate or medium logic state between the first and second logic states.

7 Claims, 7 Drawing Sheets

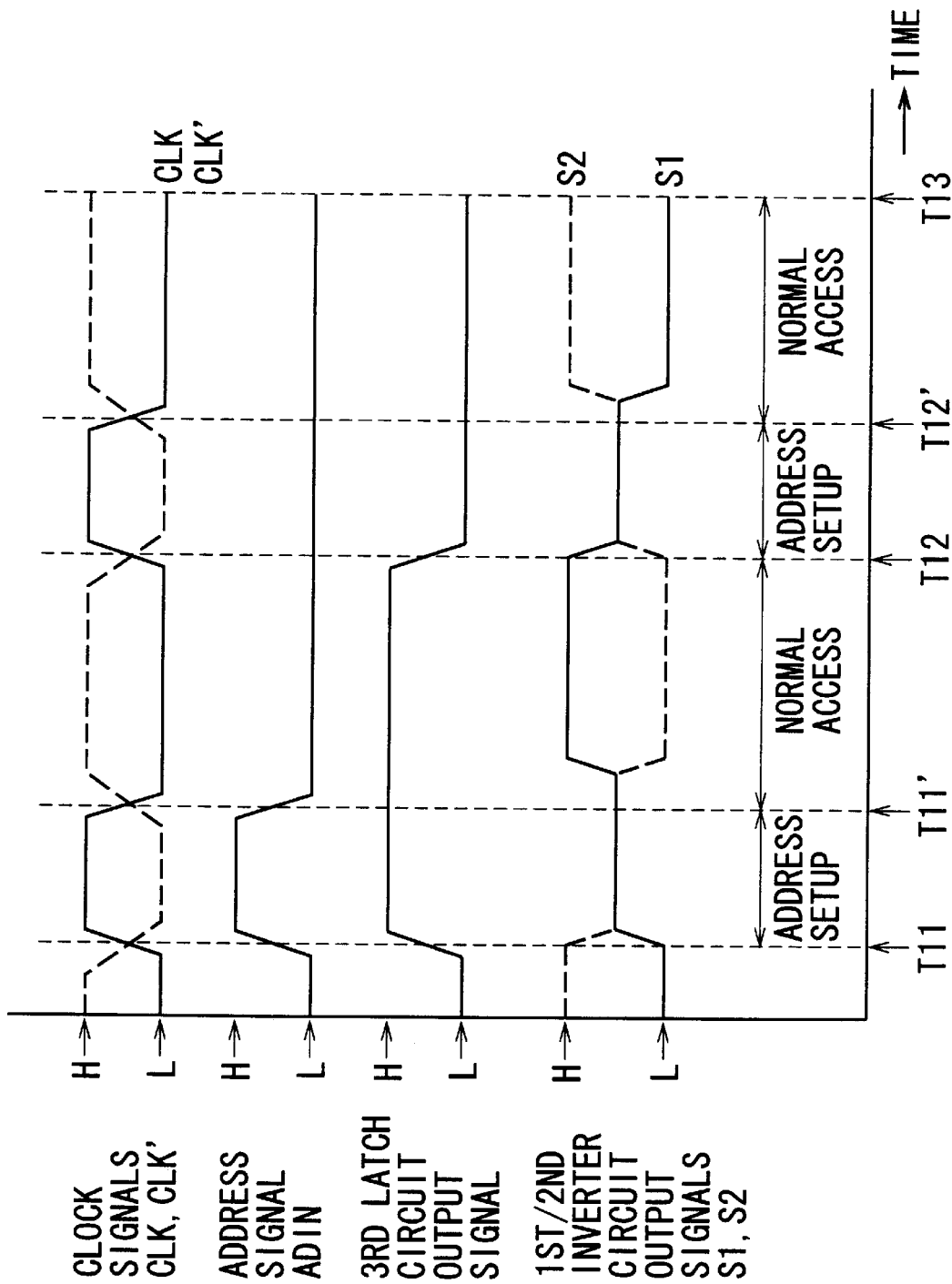

US 6,337,582 B1

BUFFER CIRCUIT

BACKGROUND OF THE INVENTION

1. Field of the Invention

The present invention relates to a buffer circuit and more particularly, to a buffer circuit that suppresses fluctuation or deviation of the power supply voltage and the ground voltage caused by the logic state change of a specific signal, which is preferably used as an address buffer circuit outputting an output signal such as an address signal in a low impedance state to the memory section of a semiconductor memory device.

2. Description of the Related Art

FIG. 1 shows an example of the conventional address buffer circuits used for semiconductor memory devices.

As shown in FIG. 1, the prior-art address buffer circuit 102 is comprised of an input stage 104, first, second, third, and fourth inverter circuits 106, 108, 110, and 112, an Address Transition Detection (ATD) circuit 114, and a wave-synthesizing pulse generator circuit 116. Only the configuration for one bit of address is shown in FIG. 1 for the sake of simplification; however, it is needless to say that the circuit 102 actually includes a lot of the same configuration as shown in FIG. 1 according to the bit count of address.

The input stage 104 is a two-input NOR gate comprising two p-channel Metal-Oxide-Semiconductor Field-Effect Transistors (MOSFETs) 131 and 132 connected in series and two n-channel MOSFETs 133 and 134 connected in parallel. The source of the p-channel MOSFET 131 is connected to the power supply line applied with a supply voltage of $V_{cc}$ while the drain of the MOSFET 131 is connected to the source of the p-channel MOSFET 132. The drain of the p-channel MOSFET 132 is connected to the coupled drains of the n-channel MOSFETs 133 and 134. The coupled sources of the n-channel MOSFETs 133 and 134 are connected to the ground. The gates of the MOSFETs 132 and 133 are connected to each other, forming the first input terminal 104a of the input stage 104. An address signal ADIN, which is an input signal of the buffer circuit 102, is supplied from the outside of the circuit 102 to the first input terminal 104a. The coupled gates of the MOSFETs 131 and 134 form the second input terminal 104b of the input stage 104. A chip enable signal CEB is supplied to the second input terminal 104b from the outside of the circuit 102. The coupled drains of MOSFETs 132, 133, and 134 constitute the output terminal 104c of the input stage 104.

When the chip enable signal CEB is at a specific logic level, the address signal ADIN is taken into the input stage 104 and the output signal having an opposite logic level to the signal ADIN is outputted at the output terminal 104c. The output signal thus outputted is then supplied to the fourth inverter circuit 112.

The first, second, third, and fourth inverter circuits 106, 108, 110, and 112 have substantially the same configuration. Therefore, the configuration of the fourth inverter circuit 112 is explained below and the detailed description about the first, second, third inverter circuits 106, 108, and 110 is omitted by adding the same reference symbols to those of the circuit 112 except for the suffix letters.

The fourth inverter circuit 112 is comprised of a p-channel MOSFET 135a and an n-channel MOSFET 136a whose drains are coupled together, which is a Complementary MOS (CMOS) inverter. The source of the MOSFET 135a is connected to the power supply line of $V_{cc}$. The source of the MOSFET 136a is connected to the ground. The gates of the MOSFETs 135a and 136a are coupled together, forming the input terminal 112a of the circuit 112. The input terminal 112a is connected to the output terminal 104c of the input stage 104. The coupled drains of the MOSFETs 135a and 136a form the output terminal 112b of the circuit 112.

The fourth inverter circuit 112 generates at the output terminal 112b an output signal having an opposite logic level to the output signal from the input stage 104. The output signal of the circuit 112 thus generated is then supplied to the ATD circuit 114 as the ATD input signal ATDIN and at the same time, it is supplied to the second and third inerter circuits 108 and 110. As shown in FIG. 1, the ATD input signal ATDIN is also supplied to specific circuits (not shown) provided outside the address buffer circuit 102.

The second inverter circuit 108, which has substantially the same configuration as the fourth inverter circuit 112, has an input terminal 108a formed by the coupled gates of a p-channel MOSFET 135b and an n-channel MOSFET 136b and an output terminal 108b formed by the coupled drains thereof. The input terminal 108a is connected to the output terminal 112b of the fourth inverter circuit 112. The circuit 108 generates at its output terminal 108b an output signal having an opposite logic level to the output signal from the fourth inverter circuit 112 supplied to the input terminal 108a. The output signal of the circuit 108 is the inverted address signal BAR, which is one of the two output signals of the address buffer circuit 102. The signal BAR is then supplied to a decoder circuit or circuits (not shown) provided outside the buffer circuit 102.

The third inverter circuit 110, which has substantially the same configuration as the fourth inverter circuit 112, has an input terminal 110a formed by the coupled gates of a p-channel MOSFET 135c and an n-channel MOSFET 136c and an output terminal 110b formed by the coupled drains thereof. The input terminal 110a is connected to the output terminal 112b of the fourth inverter circuit 112. The circuit 110 generates at its output terminal 110b an output signal having an opposite logic level to the output signal from the fourth inverter circuit 112 supplied to the input terminal 110a. The output signal of the circuit 110 is then supplied to the first inverter circuit 106.

The first inverter circuit 106, which has substantially the same configuration as the fourth inverter circuit 112, has an input terminal 106a formed by the coupled gates of a p-channel MOSFET 135d and an n-channel MOSFET 136d and an output terminal 106b formed by the coupled drains thereof. The input terminal 106a is connected to the output terminal 110b of the third inverter circuit 110. The circuit 106 generates at its output terminal 106b an output signal having an opposite logic level to the output signal from the third inverter circuit 110 supplied to the input terminal 106a. The output signal of the circuit 106 is the address signal TRUE, which is the other of the two output signals of the address buffer circuit 102. The signal TRUE is then supplied to the decoder circuit or circuits (not shown) provided outside the buffer circuit 102.

The ATD circuit 114 is supplied with the ATD input signal ATDIN outputted from the fourth inverter circuit 112. The circuit 114 detects the logic level change of the signal ATDIN (i. e., address transition) and then, outputs the ATD output signal ATDOUT to the wave-synthesizing pulse generator circuit 116.

The pulse generator circuit 116 generates a data latch signal DTL including pulses varying from the logic high level to the logic low level based on the signal ATDOUT from the ATD circuit 114, and outputs the signal DTL to specific circuits provided outside the buffer circuit 102.

The address signal TRUE, which is outputted from the first inverter circuit 106, has a waveform corresponding to that of the address signal ADIN supplied to the input stage 104 of the buffer circuit 102. Also, the inverted address signal BAR, which is outputted from the second inverter circuit 108, has an inverted waveform of the signal TRUE. In other words, the signal BAR has an inverted logic level to the signal TRUE. The address signal TRUE and the inverted address signal BAR are supplied to the memory section (not shown) located outside the buffer circuit 102 through the decoder circuit or circuits (not shown) The data latch signal DTL, which is outputted from the pulse generator circuit 116, is supplied to the memory section as well.

Data signals are outputted from the respective memory cells in the memory section according to the address signal TRUE and the inverted address signal BAR. A latch circuit or circuits (now shown) provided in the memory section latches/latch the data signals thus outputted so as to be synchronized with the data latch signal DTL.

FIG. 2 shows the waveforms of the address signal ADIN, the address signal TRUE, the inverted address signal BAR, the power supply current flowing through the power supply line, the, ground current flowing through the ground line, the power supply voltage, and the ground voltage in the prior-art address buffer circuit 102 shown in FIG. 1.

As shown in FIG. 2, the address signal ADIN supplied to the buffer circuit 102 is turned from the logic low (L) level to the logic high (H) level at the time T101 and then, returned from the logic high level to the logic low level at the time T102. According to this change of the signal ADIN, the address signal TRUE is turned from the logic low level to the logic high level at the time T101 and then, returned from the logic high level to the logic low level at the time T102. On the other hand, the inverted address signal BAR is turned from the logic high level to the logic low level at the time T101 and then, returned from the logic low level to the logic high level at the time T102.

As known well, an inverter circuit formed by MOSFETs with the CMOS configuration has a tendency that a large current flows when the input signal (and the output signal as well) is switched between the logic high and low levels. In particular, since the first and second inverter circuits 106 and 108 have high current driving capabilities, the tendency appears remarkably. Specifically, a large current tends to flow through the MOSFETs 135b and 136b in the second inverter circuit 108 and a large current tends to flow through the MOSFETs 135d and 136d in the first inverter circuit 106 at the switching time of the input and output signals between the logic high and low levels. Accordingly, as shown by the curved lines 118 and 120 in FIG. 2, the power supply current and the ground current vary largely like a spike at the times T101 and T102 at which the signals TRUE and BAR are switched between the logic high and low levels. Consequently, as shown by the symbols R101 and R102 in FIG. 2, the power supply voltage temporarily lowers while the ground voltage temporarily rises at the times T101 and T102.

As described previously, the prior-art address buffer circuit 102 actually includes a lot of the configuration shown in FIG. 1 according to the bit count of address. Also, the bit count of address is huge in recent years and thus, the count of the inverter circuits in the circuit 102 is huge, in which all the inverter circuits typically operates simultaneously with the logic state change of the address signal ADIN. As a result, the deviation or fluctuation of the power supply voltage and the ground voltage is very large and unable to be ignored.

Generally, a semiconductor memory device includes other circuits than the address buffer circuit 102 that commonly use the power supply and ground lines for the circuit 102. Thus, the above-described fluctuation or deviation of the power supply and ground voltages causes unstable operation and/or malfunction of these circuits.

SUMMARY OF THE INVENTION

Accordingly, an object of the present invention is to provide a buffer circuit that suppresses the fluctuation or deviation of the power supply voltage and the ground voltage that are caused by the logic state change of an address signal applied thereto.

Another object of the present invention is to provide a buffer circuit that prevents unstable operation and/or malfunction of other circuits using commonly the power supply and ground lines for the buffer circuit without any complicated circuit configuration.

The above objects together with others specifically mentioned will become clear to those skilled in the art from the following description.

A buffer circuit according to the present invention comprises:

(a) a first inverter circuit including a first MOSFET having a channel of a first conductivity type and a second MOSFET having a channel of a second conductivity type opposite to the first conductivity type;

a gate of the first MOSFET and a gate of the second MOSFET being coupled together, forming an input terminal of the first inverter circuit;

a first input signal at a first logic state being applied to the input terminal of the first inverter circuit;

one end of the channel of the first MOSFET and one end of the channel of the second MOSFET being coupled together, forming an output terminal of the first inverter circuit:

(b) a second inverter circuit including a third MOSFET having a channel of the first conductivity type and a fourth MOSFET having a channel of the second conductivity type;

a gate of the third MOSFET and a gate of the fourth MOSFET being coupled together, forming an input terminal of the second inverter circuit;

a second input signal at a second logic state opposite to the first logic state being applied to the input terminal of the second inverter circuit;

one end of the channel of the third MOSFET and one end of the channel of the fourth MOSFET being coupled together, forming an output terminal of the second inverter circuit:

(c) an equalization circuit for equalizing the first output signal of the first inverter circuit and the second output signal of the second inverter circuit to each other;

the equalization circuit including a fifth MOSFET having a channel of the first conductivity type and a sixth MOSFET having a channel of the second conductivity type;

one end of the channel of the fifth MOSFET and one end of the channel of the sixth MOSFET being coupled together to be connected to the output terminal of the first inverter circuit;

the other end of the channel of the fifth MOSFET and the other end of the channel of the sixth MOSFET being coupled together to be connected to the output terminal of the second inverter circuit;

gates of the fifth and sixth MOSFETs being respectively applied with control signals at opposite logic levels, thereby setting the equalization circuit in a high-impedance state or a low-impedance state;

(d) a first switching circuit for connecting the other end of the channel of the first MOSFET to a first voltage line or disconnecting it from the first voltage line;

the first switching circuit including a seventh MOSFET having a channel of the first conductivity type;

one end of the channel of the seventh MOSFET being connected to the other end of the channel of the first MOSFET;

the first switching circuit being switched by a control signal applied to a gate of the seventh MOSFET;

(e) a second switching circuit for connecting the other-end of the channel of the second MOSFET to a second voltage line or disconnecting it from the second voltage line;

the second switching circuit including an eighth MOSFET having a channel of the second conductivity type;

one end of the channel of the eighth MOSFET being connected to the other end of the channel of the second MOSFET;

the second switching circuit being switched by a control signal applied to a gate of the eighth MOSFET;

(f) a third switching circuit for connecting the other end of the channel of the third MOSFET to the first voltage line or disconnecting it from the first voltage line;

the third switching circuit including a ninth MOSFET having a channel of the first conductivity type;

one end of the channel of the ninth MOSFET being connected to the other end of the channel of the third MOSFET; and the third switching circuit being switched by a control signal applied to a gate of the ninth MOSFET;

(g) a fourth switching circuit for connecting the other end of the channel of the fourth MOSFET to the second voltage line or disconnecting it from the second voltage line;

the fourth switching circuit including a tenth MOSFET having a channel of the second conductivity type;

one end of the channel of the tenth MOSFET being connected to the other end of the channel of the fourth MOSFET;

the fourth switching circuit being switched by a control signal applied to a gate of the tenth MOSFET;

(h) the equalization circuit being set in the high-impedance state, when the first switching circuit connects the other end of the channel of the first MOSFET to the first voltage line, the second switching circuit connects the other end of the channel of the second MOSFET to the second voltage line, the third switching circuit connects the other end of the channel of the third MOSFET to the first voltage line, and the fourth switching circuit connects the other end of the channel of the fourth MOSFET to the second voltage line;

the first inverter circuit generating a first output signal in the second logic state at its output terminal and the second inverter circuit generating a second output signal in the first logic state at its output terminal; and (i) the equalization circuit being set in the low-impedance state, when the first switching circuit disconnects the other end of the channel of the first MOSFET from the first voltage line, the second switching circuit disconnects the other end of the channel of the second MOSFET from the second voltage line, the third switching circuit disconnects the other end of the channel of the third MOSFET from the first voltage line, and the fourth switching circuit disconnects the other end of the channel of the fourth MOSFET from the second voltage line;

the output terminals of the first and second inverter circuits being connected to each other by way of the equalization circuit, resulting in the first and second output signals of the first and second inverter circuits being in an approximately intermediate or medium logic state between the first and second logic states.

With the buffer circuit according to the present invention, as describe above, the first switching circuit is provided for connecting/disconnecting the other end of the channel of the first MOSFET to the first voltage line, the second switching circuit is provided for connecting/disconnecting the other end of the channel of the second MOSFET to the second voltage line, the third switching circuit is provided for connecting/disconnecting the other end of the channel of the third MOSFET to the first voltage line, and the fourth switching circuit is provided for connecting/disconnecting the other end of the channel of the fourth MOSFET to the second voltage line. Moreover, the equalization circuit is provided for equalizing the first output signal of the first inverter circuit and the second output signal of the second inverter circuit to each other.

If the first switching circuit connects the other end of the channel of the first MOSFET to the first voltage line, the second switching circuit connects the other end of the channel of the second MOSFET to the second voltage line, the third switching circuit connects the other end of the channel of the third MOSFET to the first voltage line, and the fourth switching circuit connects the other end of the channel of the fourth MOSFET to the second voltage line, the equalization circuit is set in the low-impedance state. Therefore, the first and second inverters operate normally and as a result, the first inverter circuit generates the first output signal in the second logic state at its output terminal and the second inverter circuit generates the second output signal in the first logic state at its output terminal.

On the other hand, if the first switching circuit disconnects the other end of the channel of the first MOSFET from the first voltage line, the second switching circuit disconnects the other end of the channel of the second MOSFET from the second voltage line, the third switching circuit disconnects the other end of the channel of the third MOSFET from the first voltage line, and the fourth switching circuit disconnects the other end of the channel of the fourth MOSFET from the second voltage line, the first and second inverters are unable to operate normally.

In this case, unwanted signals having opposite logic states are generated at the output terminals of the first and second inverter circuits due to the parasitic capacitances existing in the neighborhood of the gates of the first and second MOSFETs of the first inverter circuit and the gates of the third and fourth MOSFETs of the second inverter circuit This is because the input terminal of the first inverter circuit is applied with the first input signal at the first logic state while the input terminal of the second inverter circuit is applied with the second input signal at the second logic state opposite to the first logic state.

At this time, the equalization circuit is set in the low-impedance state and thus, the output terminals of the first and second inverter circuits are connected to each other by way of the equalization circuit. Therefore, the first and second output signals of the first and second inverter circuits are in an approximately intermediate or medium logic state between the first and second logic states.

Accordingly, if the first and second inverter circuits need not output their output signals, the first and second output signals of the first and second inverter circuits can be set in an approximately intermediate or medium logic state between the first and second logic states by controlling the first to fourth switching circuits and the equalization circuit in the above-described manner. Thereafter, if the first and second inverter circuits are required to output their output signals, the first and second output signals of the first and second inverter circuits are turned to the first or second logic state (i.e., the logic high or low level) from the intermediate or medium state. This means that the output signals of the first and second inverters have narrow variation ranges of voltage, which narrows the variation ranges of the power supply current. Thus, the fluctuation or deviation of the power supply voltage and the ground voltage can be effectively suppressed.

Because of the suppressed fluctuation or deviation of the power supply voltage and the ground voltage, unstable operation and/or malfunction of other circuits using commonly the power supply and ground lines for the buffer circuit can be prevented.

Since it is sufficient that the first to fourth switching circuits and the equalization circuit are additionally provided, no complicated circuit configuration is required.

BRIEF DESCRIPTION OF THE DRAWINGS

FIG. 7 is a timing diagram showing the operation of the address buffer circuit according to the second embodiment of FIG. 6.

DETAILED DESCRIPTION OF THE PREFERRED EMBODIMENTS

Figure 1:
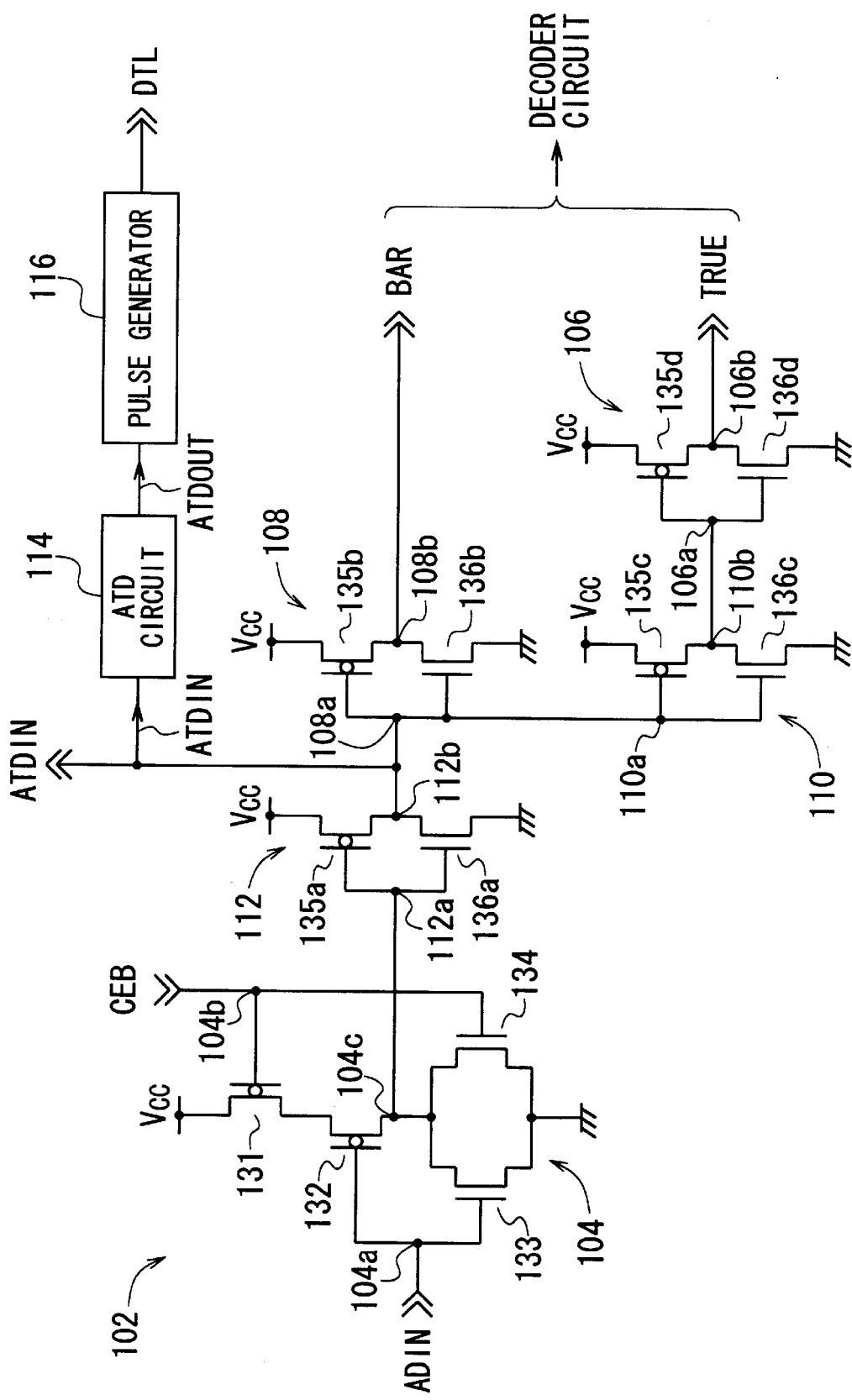
FIG. 1 is a circuit diagram showing the configuration of a prior-art address buffer circuit for semiconductor memory devices.

Preferred embodiments of the present invention will be described in detail below while referring to the drawings attached.

FIRST EMBODIMENT (Circuit Configuration)

Figure 3:
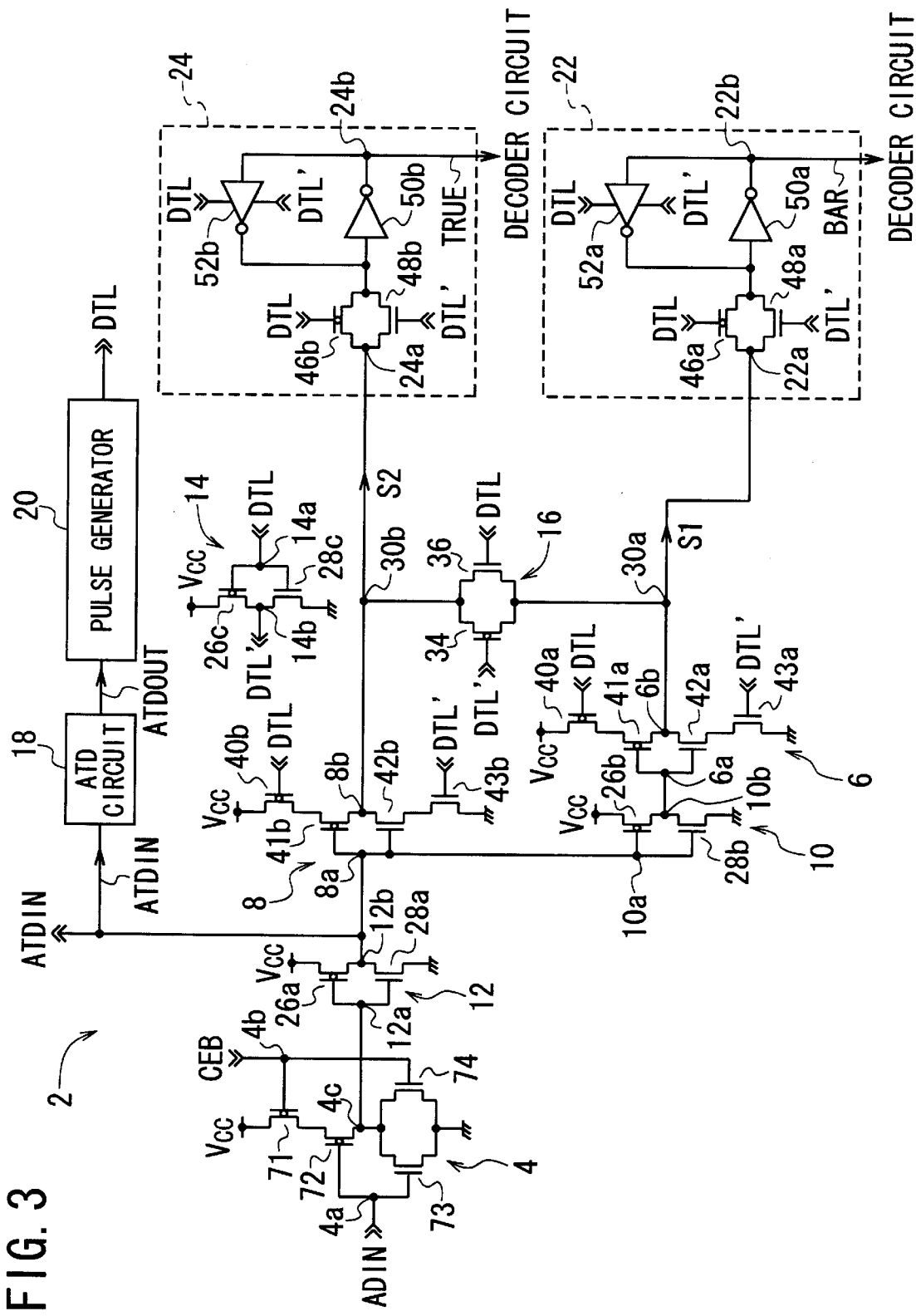
FIG. 3 is a circuit diagram showing the configuration of an address buffer circuit according to a first embodiment of the present invention, which is designed for semiconductor memory devices.

FIG. 3 shows an address buffer circuit according to a first embodiment of the present invention, which is used for a semiconductor memory device.

The address buffer circuit 2 according to the first embodiment shown in FIG. 3 is comprised of an input stage 4, a first inverter circuit 6, a second inverter circuit 8, a third inverter circuit 10, a fourth inverter circuit 12, a fifth inverter circuit 14, an equalization circuit 16, an ATD circuit 18, a wave-synthesizing pulse generator circuit 20, a first latch circuit 22, and a second latch circuit 24. Only the configuration for one bit of address is shown in FIG. 3 for the sake of simplification; however, it is needless to say that the circuit 2 actually includes a lot of the same configuration as shown in FIG. 3 according to the bit count of address.

The input stage 4 is a two-input NOR gate comprising two p-channel MOSFETs 71 and 72 connected in series and two n-channel MOSFETs 73 and 74 connected in parallel. The source of the p-channel MOSFET 71 is connected to the power supply line applied with a supply voltage of $V_{cc}$ and the drain thereof is connected to the source of the p-channel MOSFET 72. The drain of the MOSFET 72 is connected to the coupled drains of the n-channel MOSFETs 73 and 74. The coupled sources of the n-channel MOSFETs 73 and 74 are connected to the ground. The gates of the MOSFETs 72 and 73 are coupled together, forming a first input terminal 4a of the input stage 4. The first input terminal 4a is applied with an address signal ADIN from the outside of the buffer circuit 2. The gates of the MOSFETs 71 and 74 are coupled together, forming a second input terminal 4b of the input stage 4. The second input terminal 4b is applied with a chip enable signal CEB from the outside of the circuit 2. The coupled drains of the MOSFETs 72, 73, and 74 form an output terminal 4c of the input stage 4.

When the chip enable signal CEB is at a specific logic level, the address signal ADIN enters the input stage 4 and an output signal having an opposite logic level to the address signal ADIN is generated at the output terminal 4a. The output signal thus generated is then supplied to the fourth inverter circuit 12.

The fourth inverter circuit 12 comprises a p-channel MOSFET 26a and an n-channel MOSFET 28a whose drains are coupled together to form a CMOS configuration. The source of the p-channel MOSFET 26a is connected to the power supply line of $V_{cc}$ while the source of the n-channel MOSFET 28a is connected to the ground. The gates of the MOSFETs 26a and 28a are coupled together, forming an input terminal 12a of the fourth inverter circuit 12. The input terminal 12a is connected to the output terminal 4c of the input stage 4. The coupled drains of the MOSFETs 26a and 28a form an output terminal 12b of the circuit 12. The circuit, 12 generates at the output terminal 12b an output signal having an opposite logic level to the output signal applied to the input terminal 12a. The output signal of the circuit 12 thus generated is then supplied to the ATD circuit 18 as the ATD input signal, and at the same time, it is supplied to the second and third inverter circuits 8 and 10. As shown in FIG. 3, the ATD input signal ATDIN is also supplied to specific circuits (not shown) provided outside the address buffer circuit 2.

The ATD circuit 18 is supplied with the output signal of the fourth inverter circuit 12 as the ATD input signal ATDIN. The ATD circuit 18 detects the change of logic level of the ATD input signal ATDIN (i.e., address transition). The circuit 18 generates the ATD output signal ATDOUT at its output terminal when the transition of the ATD input signal ATDIN occurs.

The pulse generator circuit 20 is supplied with the output signal ATDOUT from the ATD circuit 18. The pulse generator circuit 20 generates a data latch signal DTL at its output terminal. The data latch signal DTL thus generated is a pulsed signal that switched from the logic high level to the logic low level.

The fifth inverter circuit 14 has substantially the same configuration as the fourth inverter circuit 12. Specifically, the fifth inverter circuit 14 is comprised of a p-channel MOSFET 26c and an n-channel MOSFET 28c whose drains are coupled together to form a CMOS configuration. The source of the p-channel MOSFET 26c is connected to the power supply line of $V_{cc}$ while the source of the n-channel MOSFET 28c is connected to the ground. The gates of the MOSFETs 26c and 28c are coupled together, forming an input terminal 14a of the fifth inverter circuit 14. The input terminal 14a is applied with the data latch signal DTL generated by the pulse generator circuit 20. The drains of the MOSFETs 26c and 28c are coupled together, forming an output terminal 14b of the fifth inverter circuit 14. The fifth inverter circuit 14 outputs an inverted data latch signal DTL' having an opposite logic level to the data latch signal DTL at the output terminal 14b.

The second inverter circuit 8 is comprised of two p-channel MOSFETs 40b and 41b connected in series and two n-channel MOSFETs 42b and 43b connected in series. The source of the p-channel MOSFET 41b is connected to the power supply line of $V_{cc}$ through the p-channel MOSFET 40b and the drain thereof is connected directly to the drain of the n-channel MOSFET 42b. The gate of the p-channel MOSFET 40b is applied with the data latch signal DTL outputted from the pulse generator circuit 20. The source of the n-channel MOSFET 42b is connected to the ground through the n-channel MOSFET 43b. The gate of the n-channel MOSFET 43b is applied with the inverted data latch signal DTL' outputted from the fifth inverter circuit 14. The coupled gates of the MOSFET 41b and 42b form an input terminal 8a of the second inverter circuit 8. The coupled drains of the MOSFET 41b and 42b form an output terminal 8a of the second inverter circuit 8. The input terminal 8a is connected to the output terminal 12b of the fourth inverter circuit 12.

The second inverter circuit 8 is controlled to be active or inactive by the data latch signal DTL and the inverted data latch signal DTL'. Specifically, when the data latch signal DTL is at the logic low level (i.e., the inverted data latch signal DTL' is at the logic high level), the p-channel MOSFET 40b and the n-channel MOSFET 43b are in the ON state; thus, the source-drain impedances of the MOSFETs 40b and 43b are low. Consequently, the source of the p-channel MOSFET 41b is connected to the power supply line of $V_{cc}$ by way of the p-channel MOSFET 40b and at the same time, the source of the n-channel MOSFET 42b is connected to the ground by way of the n-channel MOSFET 43b. Accordingly, the second inverter circuit 8 is active or operable, in which the circuit 8 outputs the output signal S2 having an opposite logic level to the output signal of the fourth inverter circuit 12 applied to the output terminal 8b.

On the other hand, when the data latch signal DTL is at the logic high level (i.e., the inverted data latch signal DTL' is at the logic low level), the p-channel MOSFET 40b and the n-channel MOSFET 43b are in the OFF state; thus, the source-drain impedances of the MOSFETs 40b and 43b are high. Consequently, the source of the p-channel MOSFET 41b is separated or disconnected from the power supply line of $V_{cc}$ by the p-channel MOSFET 40b and at the same time, the source of the n-channel MOSFET 42b is separated or disconnected from the ground by the n-channel MOSFET 43b. Accordingly, the second inverter circuit 8 is inactive or inoperable.

As seen from the above explanation, in the second inverter circuit 8, it may be said that the p-channel MOSFET 40b and the n-channel MOSFET 43b serve as switching circuits for activating or inactivating the CMOS inverter circuit formed by the p- and n-channel MOSFETs 41b and 42b.

The third inverter circuit 10 has substantially the same configuration as the fourth inverter circuit 12. Specifically, the circuit 10 is comprised of a p-channel MOSFET 26b and an n-channel MOSFET 28b whose drains are coupled together to form a CMOS configuration. The source of the p-channel MOSFET 26b is connected to the power supply line of $V_{cc}$ while the source of the n-channel MOSFET is connected to the ground. The gates of the MOSFETs 26b and 28b are coupled together, forming an input terminal 10a of the circuit 10. The input terminal 10a is connected to the output terminal 12b of the fourth inverter circuit 12. The coupled drains of the MOSFETs 26b and 28b form an output terminal 10b of the circuit 10. The circuit 10 generates an output signal having an opposite logic level to the output signal of the fourth inverter circuit 12 at the output terminal 10b, which is then supplied to the first inverter circuit 6.

The first inverter circuit 6 has substantially the same configuration as the second inverter circuit 8. Specifically, the circuit 6 is comprised of two p-channel MOSFETs 40a and 41a connected in series and two n-channel MOSFETs 42a and 43a connected in series. The source of the p-channel MOSFET 41a is connected to the power supply line of $V_{cc}$ through the p-channel MOSFET 40a and the drain thereof is connected directly to the drain of the n-channel MOSFET 42a. The gate of the p-channel MOSFET 40a is applied with the data latch signal DTL outputted from the pulse generator circuit 20. The source of the n-channel MOSFET 42a is connected to the ground through the n-channel MOSFET 43a. The gate of the n-channel MOSFET 43a is applied with the inverted data latch signal DTL' outputted from the fifth inverter circuit 14. The coupled gates of the MOSFET 41a and 42a form an input terminal 6a of the first inverter circuit 6. The coupled drains of the MOSFET 41a and 42a form an output terminal 6a of the circuit 6. The input terminal 6a is connected to the output terminal 10b of the third inverter circuit 10.

Similar to the second inverter circuit 8, the first inverter circuit 6 is controlled to be active or inactive by the data latch signal DTL and the inverted data latch signal DTL'. Specifically, when the data latch signal DTL is at the logic low level (i.e., the inverted data latch signal DTL' is at the logic high level), the p-channel MOSFET 40a and the n-channel MOSFET 43a are in the ON state; thus, the source-drain impedances of the MOSFETs 40a and 43a are low. Consequently, the source of the p-channel MOSFET 41a is connected to the power supply line of $V_{cc}$ by way of the p-channel MOSFET 40a and at the same time, the source of the n-channel MOSFET 42a is connected to the ground by way of the n-channel MOSFET 43a. Accordingly, the first inverter circuit 6 is active or operable, in which the circuit 6 outputs the output signal S1 having an opposite logic level to the output signal of the third inverter circuit 10 at the output terminal 6b.

On the other hand, when the data latch signal DTL is at the logic high level (i.e., the inverted data latch signal DTL' is at the logic low level), the p-channel MOSFET 40a and the n-channel MOSFET 43a are in the OFF state; thus, the source-drain impedances of the MOSFETs 40a and 43a are high. Consequently, the source of the p-channel MOSFET 41a is separated or disconnected from the power supply line of $V_{cc}$ by the p-channel MOSFET 40a and at the same time, the source of the n-channel MOSFET 42a is separated or disconnected from the ground by the n-channel MOSFET 43a. Accordingly, the first inverter circuit 6 is inactive or inoperable.

As seen from the above explanation, in the first inverter circuit 6, it may be said that the p-channel MOSFET 40a and the n-channel MOSFET 43a serve as switching circuits for activating or inactivating the CMOS inverter circuit formed by the p- and n-channel MOSFETs 41a and 42a.

The equalization circuit 16 is comprised of a p-channel MOSFET 34 and an n-channel MOSFET 36. The source of the p-channel MOSFET 34 and the drain of the n-channel MOSFET 36 are coupled together to be connected to the output terminal 8b of the second inverter circuit 8 at the point 30b. The drain of the MOSFET 34 and the source of the n-channel MOSFET 36 are coupled together to be connected to the output terminal 6b of the first inverter circuit 6 at the point 30a. The gate of the p-channel MOSFET 34 is applied with the inverted data latch signal DTL' outputted by the fifth inverter circuit 14. The gate of the n-channel MOSFET 36 is applied with the data latch signal DTL outputted by the pulse generator circuit 20.

In the equalization circuit 16, when the data latch signal DTL is at the logic high level (i.e., the inverted data latch signal DTL is at the logic low level), both the MOSFETs 34 and 36 are in the ON state and therefore, the source-drain impedances of the MOSFETs 34 and 36 are low. In other words, the equalization circuit 16 is in the low-impedance state. Consequently, due to the approximate short-circuit state of the equalization circuit 16, the output terminal 6b of the first inverter circuit 6 and the output terminal 8b of the second inverter circuit 8 are connected to each other through the equalization circuit 16. Thus, the output signals S1 and S2 of the first and second inverter circuits 6 and 8 are equalized to have an intermediate or medium logic level between the logic high and low levels. The signals S1 and S2 having the intermediate or medium logic level are then supplied to the first and second latch circuits 22 and 24, respectively.

On the other hand, when the data latch signal DTL is at the logic low level (i.e., the inverted data latch signal is at the logic high level), the MOSFETs 34 and 36 are in the OFF state and therefore, the source-drain impedances of the MOSFETs 34 and 36 are high. In other words, the equalization circuit 16 is in the high-impedance state. Consequently, the output terminal 6b of the first inverter circuit 6 is separated or disconnected from the output terminal 8b of the second inverter circuit 8. Thus, the output signals S1 an S2 of the first and second inverter circuits 6 and 8 are independently supplied to the first and second latch circuits 22 and 24 without the equalization operation, respectively.

The first latch circuit 22 is comprised of a p-channel MOSFET 46a, an n-channel MOSFET 48a, an inverter circuit 50a, and a clocked inverter circuit 52a. The source of the p-channel MOSFET 46a is connected to the drain of the n-channel MOSFET 48a, forming an input terminal 22a of the first latch circuit 22. The drain of the p-channel MOSFET 46a is connected to the source of the n-channel MOSFET 48a, forming an input terminal 22a of the first latch circuit 22. The input terminal 22a is connected to the point 30a. The source of the MOSFET 46a and the drain of the MOSFET 48a are coupled together to be connected to the input terminal of the inverter circuit 50a. The gate of the MOSFET 48a is applied with the inverted data latch signal DTL' outputted from the fifth inverter circuit 14. The gate of the MOSFET 46a is applied with the data latch signal DTL outputted from the pulse generate or circuit 20. The output terminal of the inverter circuit 50a is connected to the input terminal of the clocked inverter circuit 52a, forming an output terminal 22b of the first latch circuit 22. The output terminal of the clocked inverter circuit 52a is connected to the input terminal of the inverter circuit 50a. The clocked inverter circuit 52a is supplied with the data latch signal DTL and the inverted data latch signal DTL' as control signals.

The first latch circuit 22 latches a signal having an opposite logic level to the output signal S1 of the first inverter circuit 6 and outputs the latched signal at the output terminal 22b as the inverted address signal BAR. Specifically, when the data latch signal DTL is at the logic low level (i.e., the inverted data latch signal OTL' is at the logic high level), both the MOSFETs 46a and 48a are in the ON state and therefore, the output signal S1 of the first inverter circuit 6 is applied to the input terminal of the inverter circuit 50a. At this time, the clocked inverter circuit 52a is inactive and as a result, the inverter circuit 50a outputs the inverted address signal BAR having an opposite logic level to the output signal S1.

On the other hand, when the data latch signal DTL is at the logic high level (i.e., the inverted data latch signal DTL' is at the logic low level), the MOSFETs 46a and 48a are in the OFF state and therefore, the output signal S1 is not applied to the input terminal of the inverter circuit 50a. At this time, the clocked inverter circuit 52a is active and as a result, a positive feedback loop is formed by the inverter circuit 50a and the clocked inverter circuit 52a. Thus, a signal having an opposite logic level to the output signal S1 at the time just before the data latch signal DTL is turned from the logic low level to the logic high level (i.e., just before the inverted data latch signal DTL' is turned from the logic high level to the logic low level) is latched. The signal thus latched is then outputted at the output terminal 22b as the inverted address signal BAR.

The second latch circuit 24 has substantially the same configuration as the first latch circuit 22. Specifically, the second latch circuit 24 is comprised of a p-channel MOSFET 46b, an n-channel MOSFET 48b, an inverter circuit 50b, and a clocked inverter circuit 52b. The source of the p-channel MOSFET 46b is connected to the drain of the n-channel MOSFET 48b, forming an input terminal 24b of the second latch circuit 24. The drain of the p-channel MOSFET 46b is connected to the source of the n-channel MOSFET 48b, forming an input terminal 24a of the second latch circuit 24. The input terminal 24a is connected to the point 30b. The source of the MOSFET 46b and the drain of the MOSFET 48b are coupled together to be connected to the input terminal of the inverter circuit 50b. The gate of the MOSFET 48b is applied with the inverted data latch signal DTL'. The gate of the MOSFET 46b is applied with the data latch signal DTL. The output terminal of the inverter circuit 50b is connected to the input terminal of the clocked inverter circuit 52b, forming an output terminal 24b of the second latch circuit 24. The output terminal of the clocked inverter circuit 52b is connected to the input terminal of the inverter circuit 50b. The clocked inverter circuit 52b is supplied with the data latch signal DTL and the inverted data latch signal DTL' as control signals.

Similar to the first latch circuit 22, the second latch circuit 24 latches a signal having an opposite logic level to the output signal S2 of the second inverter circuit 8 and outputs the latched signal at the output terminal 24b as the address signal TRUE. Specifically, when the data latch signal DTL is at the logic low level (i.e., the inverter data latch signal DTL' is at the logic high level), both the MOSFETs 46a and 48a are in the ON state and therefore, the output signal S2 of the second inverter signal 8 is applied to the input terminal of the inverter circuit 50b. At this time, the clocked inverter circuit 52b is inactive and as a result, the inverter circuit 50b outputs the inverted address signal TRUE having an opposite logic level to the output signal S2.

On the other hand, when the data latch signal DTL is at the logic high level (i.e., the inverted data latch signal DTL' is at the logic low level), the MOSFETs 46b and 48b are in the OFF state and therefore, the output signal S2 is not applied to the input terminal of the inverter circuit 50b. At this time, the clocked inverter circuit 52b is active and as a result, a positive feedback loop is formed by the inverter circuit 50b and the clocked inverter circuit 52b. Thus, a signal having an opposite logic level to the output signal S2 at the time just before the data latch signal DTL is turned from the logic low level to the logic high level (i.e., just before the inverted data latch signal DTL' is turned from the logic high level to the logic low level) is latched. The signal thus latched is then outputted at the output terminal 24b as the address signal TRUE.

The address signal TRUE outputted from the second latch circuit 24 has a waveform corresponding to the address signal ADIN supplied to the input stage 4. The inverted address signal BAR outputted from the first latch circuit 22 has an inverted waveform of the address signal TRUE. The address signal TRUE and the inverted address signal BAR are then supplied to the memory section (not shown) by way of a decoder circuit or circuits (not shown). The memory section and the decoder circuit or circuits are located outside the address buffer circuit 2. The data latch signal DTL outputted from the pulse generator circuit 20 is supplied to the memory section as well.

In the memory section, the data signal is outputted from the specified memory cells according to the address signal TRUE and the inverted address signal BAR. The latch circuit or circuits (not shown) in the memory section latch/ latches the data signal thus read out so as to be synchronized with the data latch signal DTL.

(Circuit Operation)

Figure 4:
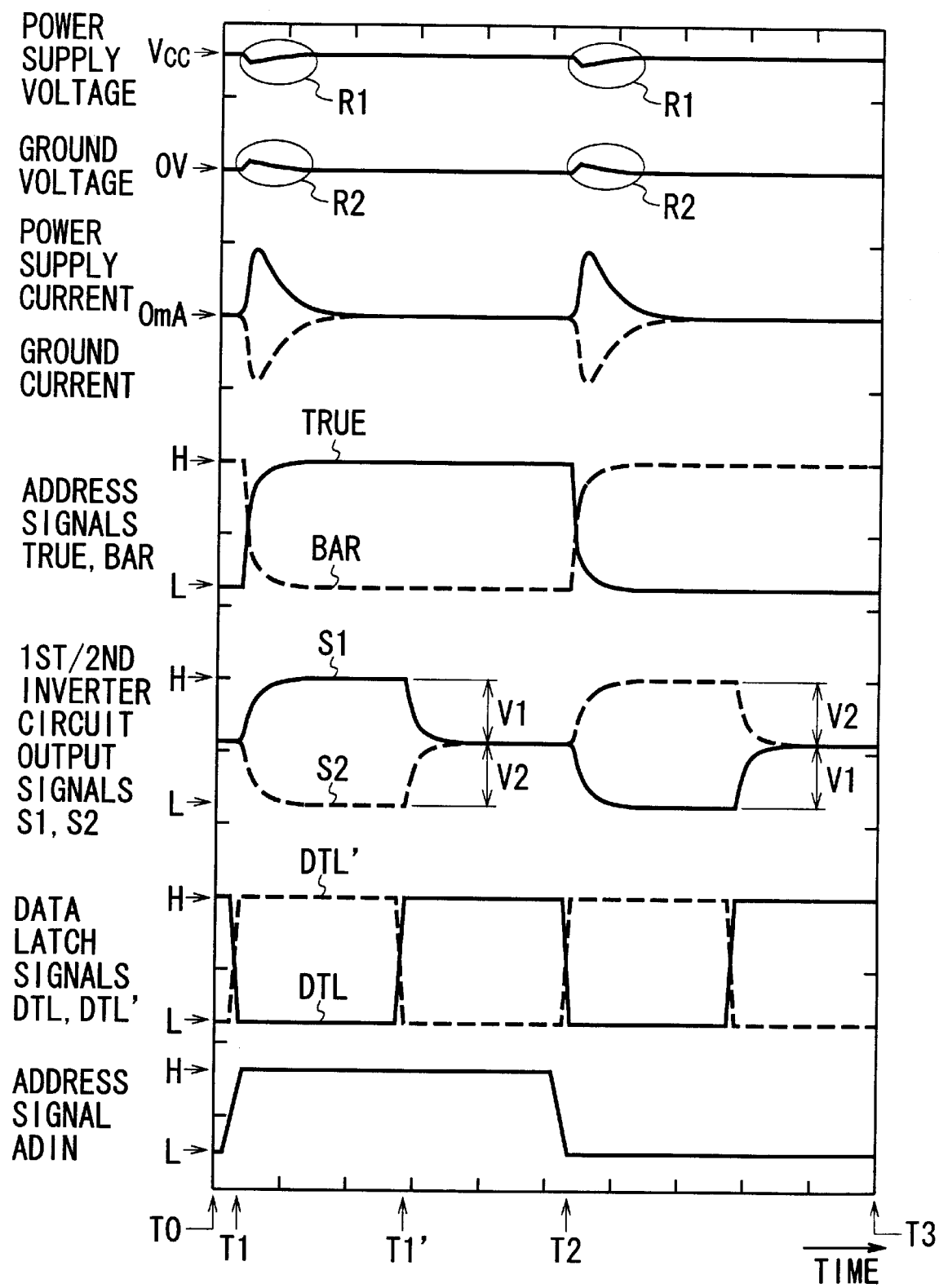
FIG. 4 is a waveform diagram of the address signal ADIN, the address signal TRUE, the inverted address signal BAR, the power supply current flowing through the power supply line, the ground current flowing through the ground line, the power supply voltage, and the ground voltage, which shows the operation of the address buffer circuit according to the first embodiment of FIG. 3.

Next, the operation of the address buffer circuit 2 according to the first embodiment in FIG. 3 will be explained below while referring to the waveform diagram shown in FIG. 4.

Here, the following supposition is taken.

Figure 2:
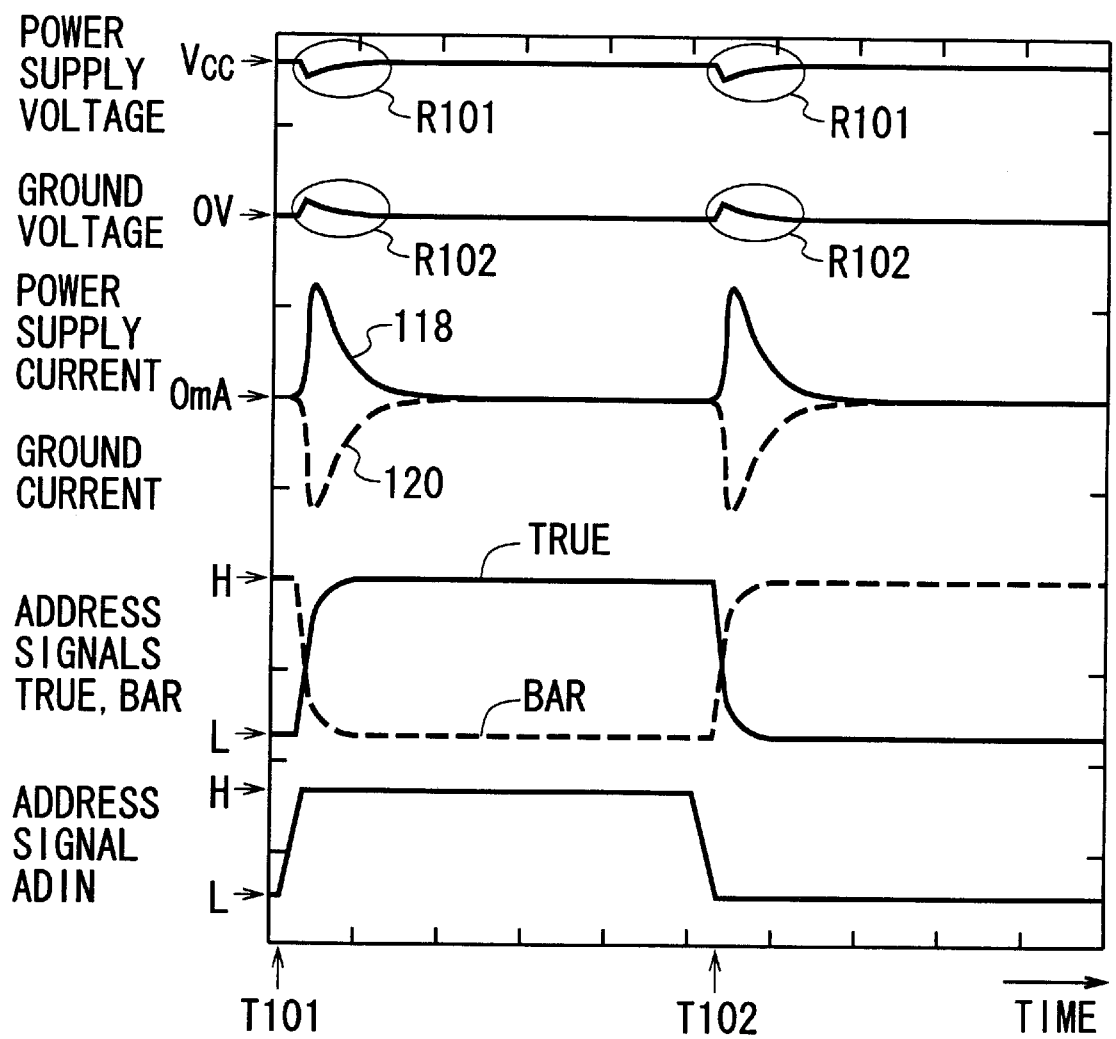
FIG. 2 is a waveform diagram of the address signal ADIN, the address signal TRUE, the inverted address signal BAR, the power supply current flowing through the power supply line, the ground current flowing through the ground line, the power supply voltage, and the ground voltage, which shows the operation of the prior-art address buffer circuit shown in FIG. 1.

Specifically, as shown in FIG. 2, the address signal ADIN supplied to the address buffer circuit 2 is turned from the logic low level to the logic high level at the time T1 and then, returned from the logic high level to the logic low level at the time T2. The chip enable signal CEB was turned from the logic low level to the logic high level prior to the time T0 and therefore, the address signal ADIN has already been supplied to the input stage 4 at the time T0. The first latch circuit 22 has already latched the signal having the logic high level and the second latch circuit 24 has already latched the signal having the logic low level at the time T0.

At the time T0, the address signal ADIN is at the logic low level and the output signal of the input stage 4 is at the logic high level. Also, the output signal of the fourth inverter circuit 12 (i.e., the ATD input signal ADTIN) is at the logic low level and the output signal of the third inverter circuit 10 is at the logic high level. The data latch signal DTL outputted from the pulse generator circuit 20 is at the logic high level and the inverted data latch signal DTL' outputted from the fifth inverter circuit 14 is at the logic L level.

Moreover, at the time T0, the p-channel MOSFET 40a and the n-channel MOSFET 42a of the first inverter circuit 6 are in the OFF state and thus, the first inverter circuit 6 is inactive. The p-channel MOSFET 40b and the n-channel MOSFET 42b of the second inverter circuit 8 are in the OFF state and thus, the second inverter circuit 8 is inactive. In the inactive state, unwanted signals and having different logic levels from each other are respectively induced at the output terminals 6b and 8b of the first and second inverter circuits 6 and 8. This is due to the parasitic capacitance existing in the neighborhood of the gates of the p-channel MOSFETs 41a and 41b and that in the neighborhood of the gates of the n-channel MOSFETs 42a and 42b.

In the equalization circuit 16, at the time T0, the p-channel MOSFET 34 and the n-channel MOSFET are in the ON state. Therefore, the output terminal 6b of the first inverter circuit 6 and the output terminal 8b of the second inverter circuit 8 are connected or short-circuited to each other by way of the equalization circuit 16. Accordingly, the output signals S1 and S2 of the first and the second inverter circuits at the time T0 are equalized in logic level by the equalization circuit 16 and as a result, both the signals S1 and S2 are at the logic intermediate or medium level between the logic high and low levels.

At this time (i.e., at the time T0), in the first latch circuit 22, the p-channel MOSFET 46a and the n-channel MOSFET 48a are in the OFF state. Thus, the output signal S1 is not applied to the inverter circuit 50a of the first latch circuit 22 and as a result, the address signal BAR outputted from the circuit 22 is at the logic high level. In the second latch circuit 24, similar to the first latch circuit 22, the p-channel MOSFET 46b and the n-channel MOSFET 48b are in the OFF state. Thus, the output signal S2 is not applied to the inverter circuit 50b of the second latch circuit 24 and as a result, the address signal TRUE outputted from the circuit 24 is at the logic high level.

Subsequently, at the time T1, the address signal ADIN is turned from the logic low level to the logic high level. At this time, the output signal of the input stage 4 is turned from the logic high level to the logic low level, the output signal of the fourth inverter circuit 12 (i.e., the signal ATDIN) is turned from the logic low level to the logic high level, and the output signal of the third inverter circuit 10 is turned from the logic high level to the logic low level.

In the ATD circuit 18, at the time T1, the logic level change of the ATD input signal ATDIN is detected and then, the output signal ATDOUT is outputted to the pulse generator circuit 20.

In the pulse generator circuit 20, the data latch signal DTL having a specific pulse width is generated and outputted. The data latch signal DTL thus generated is turned from the logic high level to the logic low level at the time T1, and returned from the logic low level to the logic high level at the time T1'.

In the fifth inverter circuit 14, the inverted data latch signal DTL' is generated and outputted. The inverted data latch signal DTL' is turned from the logic low level to the logic high level at the time T1, and returned from the logic high level to the logic low level at the time T1'.

In the first inverter circuit 6, at the time T1, the p-channel MOSFET 40a and the n-channel MOSFET 42a are turned on and therefore, the circuit 6 is activated. Thus, the output signal of the third inverter circuit 10, which has been turned from the logic high level to the logic low level, is supplied to the first inverter circuit 6. Similarly, in the second inverter circuit 8, the p-channel MOSFET 40b and the n-channel MOSFET 43b are turned on at the time T1 and therefore, the circuit 8 is activated. Thus, the output signal of the fourth inverter circuit 12, which has been turned from the logic low level to the logic high level, is supplied to the second inverter circuit 8.

In the equalization circuit 16, at the time T1, the p-channel MOSFET 34 and the n-channel MOSFET 36 are turned off and therefore, the output terminal 6b of the first inverter circuit 6 is separated or disconnected from the output terminal 8b of the second inverter circuit 8. As a result, the output signal S1 of the first inverter circuit 6 is turned from the logic intermediate or medium level to the logic high level while the output signal S2 of the second inverter circuit 6 is turned from the logic intermediate or medium level to the logic low level.

In the first latch circuit 22, at the time T1, the p-channel MOSFET 46a and the n-channel MOSFET 48a are turned on and therefore, the output signal S1 of the first inverter circuit 6 is supplied to the inverter circuit 50a of the circuit 22. Thus, the inverted address signal BAR outputted from the circuit 22 is turned from the logic high level to the logic low level.

In the second latch circuit 24, at the time T1, similar to the first latch circuit 22, the p-channel MOSFET 46b and the n-channel MOSFET 28b are turned on and therefore, the output signal S2 of the second inverter circuit 6 is supplied to the inverter circuit 50b of the circuit 24. Thus, the address signal TRUE outputted from the circuit 24 is turned from the logic high level to the logic low level.

Subsequently, at the time T1', the data latch signal DTL is turned from the logic low level to the logic high level (i.e., the inverted data latch signal DTL' is turned from the logic high level to the logic low level). Then, the p-channel MOSFET 40a and the n-channel MOSFET 42a of the first inverter circuit 6 are turned off and therefore, the circuit 6 is inactivated. Similarly, the p-channel MOSFET 40b and the n-channel MOSFET 42b of the second inverter circuit 8 are turned off and therefore, the circuit 8 is inactivated as well. In the inactive state, similar to the case at the time T0, the output signals S1 and S2 having opposite logic levels to each other are respectively induced at the output terminals 6b and 8b of the first and second inverter circuits 6 and 8 due to the parasitic capacitance in the neighborhood of the gates of the p-channel MOSFETs 41a and 41b and that in the neighborhood of the gates of the n-channel MOSFETs 42a and 42b.

In the equalization circuit 16, at the time T1', the p-channel MOSFET 34 and the n-channel MOSFET are turned on and therefore, the output terminal 6b of the first inverter circuit 6 and the output terminal 8b of the second inverter circuit 8 are connected through the equalization circuit 16. This is similar to the case at the time T0. Accordingly, the output signals S1 and S2 of the inverter circuits 6 and 8 are equalized by the circuit 16. As a result, the output signal S1 is turned from the logic high level to the logic intermediate or medium level and at the same time, the output signal S2 is turned from the logic low level to the logic intermediate or medium level.

In the first latch circuit 22, at the time T1', the p-channel MOSFET 46a and the n-channel MOSFET 48a are turned off and therefore, the supply of the output signal S1 of the first inverter circuit 6 to the inverter circuit 50a of the first latch circuit 22 is stopped Also, since the clocked inverter circuit 52a is activated at the time T1', the inverter circuit 50a and the clocked inverter circuit 52a form a positive feedback loop. As a result, the logic level of the inverted address signal BAR just before the time T1' is kept unchanged at the time T1'. This means that the inverted address signal BAR is kept at the logic low level until the subsequent time T2.

In the second latch circuit 24, at the time T1', similar to the first latch circuit 22, the p-channel MOSFET 46b and the n-channel MOSFET 48b are turned off and therefore, the supply of the output signal S2 of the second inverter circuit 8 to the inverter circuit 50b of the second latch circuit 24 is stopped. Also, since the clocked inverter circuit 52b is activated at the time T1', the inverter circuit 50b and the clocked inverter circuit 52b form a positive feedback loop. As a result, the logic level of the address signal TRUE just before the time T1' is kept unchanged at the time T1'. This means that the address signal TRUE is kept in the logic high level until the subsequent time T2.

The operation during the subsequent times T2 and T3 is the same as that during the times T1 to T2 except that each of the address signal ADIN, the data latch signal DTL, the inverted data latch signal DTL', the output signals S1 and S2 of the first and second inverter circuits 6 and 8, the address signal TRUE, and the inverted address signal BAR is at the opposite logic level. Accordingly, the explanation about the operation is omitted here for simplification.

As described above, with the address buffer circuit according to the first embodiment of FIG. 3, each of the output signals S1 and S2 of the first and the second inverter circuits 6 and 8 is turned from the logic intermediate or medium level to the logic high or low level according to the logic level change of the address signal ADIN. In other words, as shown in FIG. 4, the voltage changes V1 and V2 of the output signals S1 and S2 are reduced in amplitude. Accordingly, the change of the current flowing through the MOSFETs 40a, 41a, 42a, and 43a of the first inverter circuit 6 and that of the current flowing through the MOSFETs 40b, 41b, 42b, and 43b of the second inverter circuit 8 are decreased compared with the prior-art address buffer circuit 102. As a result, as shown in FIG. 4, the changes of the power supply and ground currents are decreased, thereby suppressing the fluctuation of the supply voltage $V_{cc}$ and the ground voltage, as indicated by the marks R1 and R2 in FIG. 4.

Since the address buffer circuit 2 according to the first Embodiment actually includes a lot of the same configuration as shown in FIG. 3 according to the bit count of address, the circuit 2 includes a lot of other inverter circuits (not shown) having the same configuration as the first and second inverter circuits 6 and 8. Also, the bit count of address in the semiconductor memory device is huge in recent years and thus, the count of the inverter circuits in the circuit 2 is huge, in which all the inverter circuits typically operates simultaneously with the logic state change of the address signal ADIN. However, with the circuit 2, the fluctuation of the supply voltage $V_{cc}$ and the ground voltage is suppressed. Thus, unstable operation or malfunction of other circuits that commonly use the power supply and ground lines for the address buffer circuit 2 can be effectively prevented.

Moreover, to generate the signal having the logic intermediate or medium level between the logic high and low levels, the address buffer circuit 2 utilizes the fact that the signals having different logic levels from each other are inputted or outputted in the first and second inverter circuits 6 and 8. Thus, it is unnecessary to provide any extra power supply circuit for this purpose. This means that the circuit configuration is not complicated.

Furthermore, the output signals S1 and S2 of the first and second inverter circuits 6 and 8 in the active state are kept unchanged by the first and second latch circuits 22 and 24. Thus, there is no possibility that the unwanted signal having the logic intermediate or medium level is outputted from the buffer circuit 2 as the address signal TRUE or the inverted address signal BAR.

(Test Result)

Figure 5:
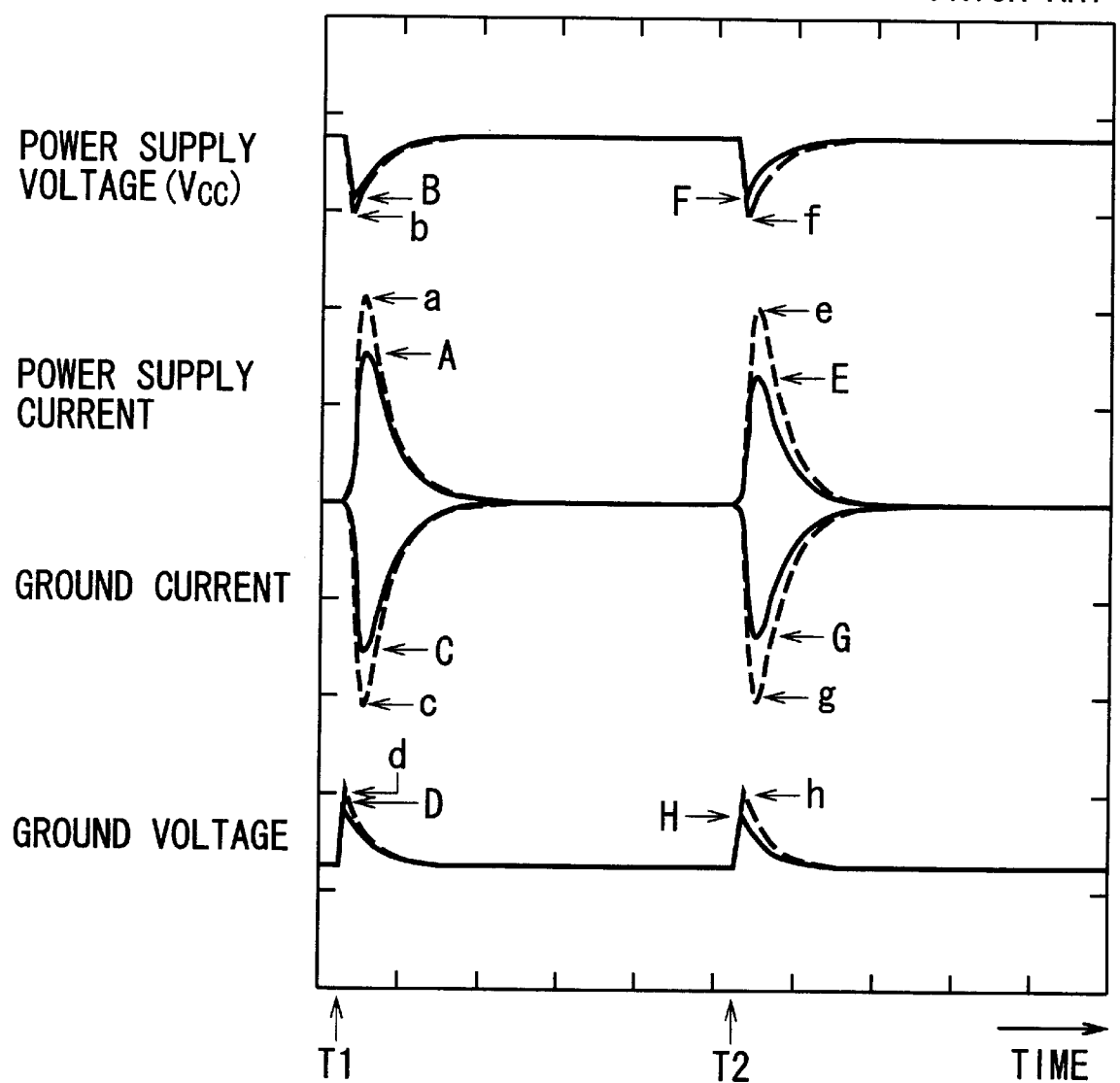
FIG. 5 is a waveform diagram showing the result of measurement for the change of the power supply current, the ground current, the power supply voltage, and the ground voltage in the address buffer circuit according to the first embodiment of FIG. 3 and the prior-art address buffer circuit of FIG. 1.

FIG. 5 shows the measurement result of fluctuation of the supply voltage, the ground voltage, the supply current, and the ground current of the prior-art address buffer circuit 102 shown in FIG. 1 and the address buffer circuit 2 according to the first embodiment shown in FIG. 3. The measurement was conducted by the inventor to confirm the advantages of the invention. The result of the inventive circuit 2 is indicated by the solid lines while the result of the prior-art circuit 102 is indicated by the broken lines in FIG. 5.

As seen from FIG. 5, the fluctuations of the supply voltage, the ground voltage, the supply current, and the ground current of the address buffer circuit 2 were smaller than those of the prior-art address buffer circuit 102 at the times T1 and T2 at which the logic state of the address signal ADIN was changed.

The following Tables 1 and 2 show the peak values of the supply voltage, the ground voltage, the supply current, and the ground current. The reference characters a to h and A to H in Tables 1 and 2 denote the points or peaks shown in FIG. 5.

TABLE 1

| PRIOR ART | | FIRST EMBODIMENT | | ADVANTAGE |
|---|---|---|---|---|
| a: Fluctuation of power supply current (mA) | 3.13 | A: Fluctuation of power supply current (mA) | 2.28 | 27.2% DECREASE |
| b: Fluctuation of power supply voltage (V) | −0.34 | B: Fluctuation of power supply voltage (V) | −0.23 | 32.4% DECREASE |
| c: Fluctuation of power supply current (mA) | −3.20 | C: Fluctuation of power supply current (mA) | −2.32 | 27.5% DECREASE |
| d: Fluctuation of power supply voltage (V) | 0.33 | D: Fluctuation of power supply voltage (V) | 0.24 | 27.3% DECREASE |

TABLE 2

| PRIOR ART | | FIRST EMBODIMENT | | ADVANTAGE |
|---|---|---|---|---|
| e: Fluctuation of power supply current (mA) | 3.04 | E: Fluctuation of power supply current (mA) | 1.98 | 34.9% DECREASE |
| f: Fluctuation of power supply voltage (V) | −0.34 | F: Fluctuation of power supply voltage (V) | −0.20 | 41.2% DECREASE |
| g: Fluctuation of power supply current (mA) | −3.04 | G: Fluctuation of power supply current (mA) | −2.01 | 33.9% DECREASE |
| h: Fluctuation of power supply voltage (V) | 0.32 | H: Fluctuation of power supply voltage (V) | 0.21 | 34.4% DECREASE |

As seen from Tables 1 and 2, the fluctuations of the supply voltage, the ground voltage, the supply current, and the ground current of the address buffer circuit 2 according to the first embodiment were decreased by more than 27% than those of the prior-art address buffer circuit 102. In particular, when the address signal ADIN was turned from the logic high level to the logic low level, the effect to suppress the fluctuations was conspicuous, in which the fluctuation was decreased by approximately 41% at the maximum.

SECOND EMBODIMENT

Figure 6:
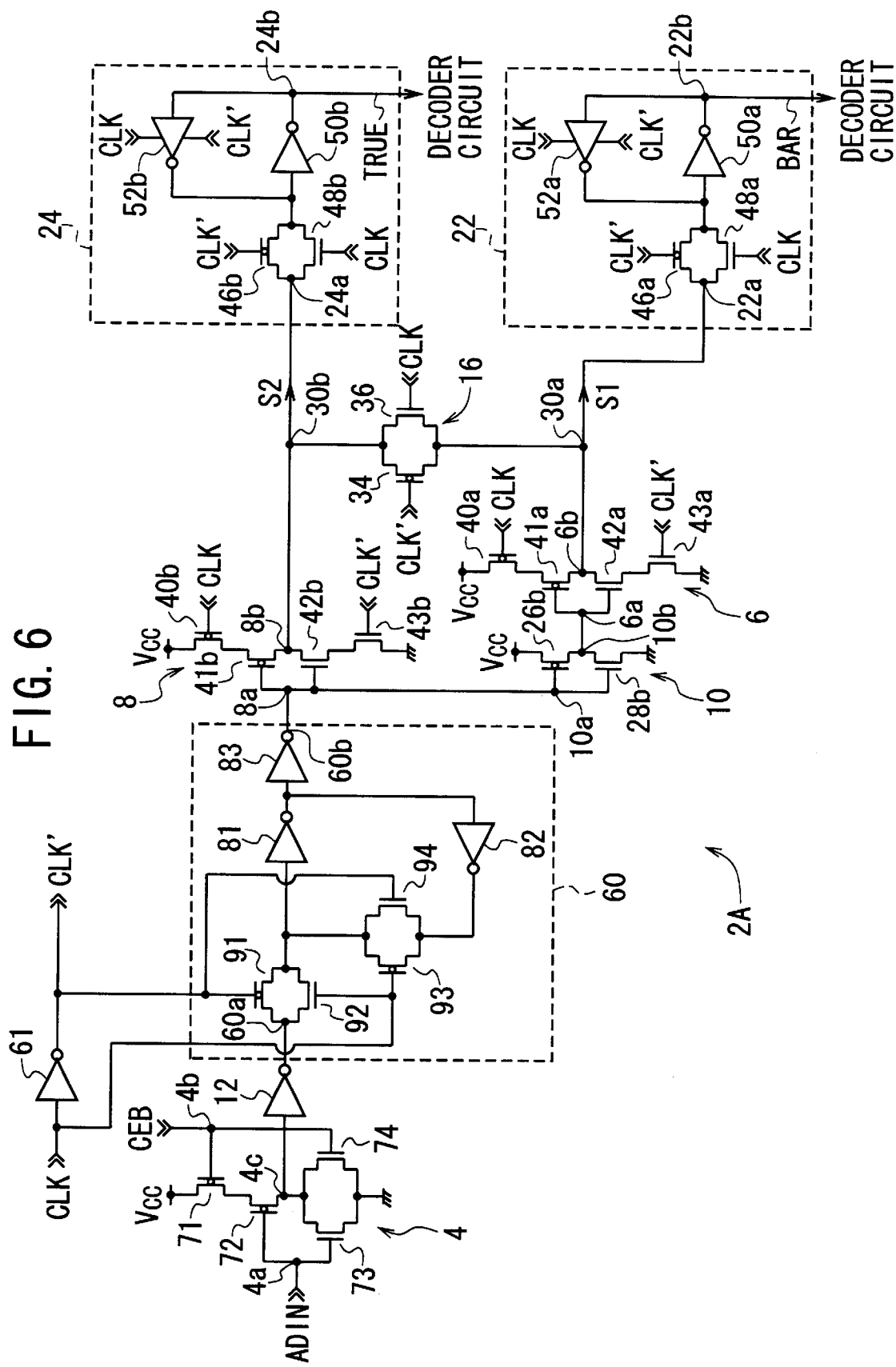
FIG. 6 is a circuit diagram showing the configuration of an address buffer circuit according to a second embodiment of the present invention, which is designed for semiconductor memory devices.

FIG. 6 shows an address buffer circuit 2A according a second embodiment of the present invention, which is comprised of an input stage 4, a first inverter circuit 6, a second inverter circuit 8, a third inverter circuit 10, a fourth inverter circuit 12, a first latch circuit 22, a second latch circuit 24, and a third latch circuit 60. This configuration is the same as that of the circuit 2 according to the first embodiment except that the fifth inverter circuit 14 is omitted, that the third latch circuit 60 and the inverter circuit 61 are added, and that the clock signal CLK is used as the control signals instead of the data latch signal DTL.

The input stage 4, the first, second, third and fourth inverter circuits 6, 8, 10, and 12, and the first and second latch circuits 22 and 24 in the address buffer circuit 2A are the same in configuration and operation as those in the circuit 2 according to the first embodiment of FIG. 3. Therefore, the explanation about these circuits is omitted here by attaching the same reference symbols as those used in FIG. 3 to the same or corresponding elements and/or circuits in FIG. 6 for the sake of simplification.

As shown in FIG. 6, with the address buffer circuit 2A according to the second embodiment, the output terminal of the fourth inverter circuit 12 is commonly connected to the input terminals 8a and 10a of the second and third inverter circuits 8 and 10 by way of the third latch circuit 60.

The third latch circuit 60 is comprised of two p-channel MOSFETs 91 and 93, two n-channel MOSFETs 92 and 94, and three inverter circuits 81, 82, and 83.

The source of the p-channel MOSFET 91 is connected to the drain of the n-channel MOSFET 92, forming the input terminal 60a of the circuit 60. The drain of the MOSFET 91 and the source of the MOSFET 92 are coupled together to be connected to the input terminal of the inverter circuit 81. The source of the MOSFET 93 is coupled with the drain of the MOSFET 94 to be connected to the coupled drain and source of the MOSFETs 91 and 92. The coupled drain and source of the MOSFETs 91 and 92 are connected to the output terminal of the inverter circuit 82. The gates of the MOSFETs 92 and 93 are coupled together to be supplied with the clocked signal CLK for controlling the semiconductor memory device. The signal CLK is sent from the outside of the address buffer circuit 2A. The gates of the MOSFETs 91 and 94 are coupled together to be supplied with the inverted clocked signal CLK'. The signal CLK' is produced and sent by the inverter circuit 61 located outside the circuit 2A.

The output terminal of the inverter circuit 81 is commonly connected to the input terminals of the inverter circuits 82 and 83. The output terminal of the inverter circuit 83 forms the output terminal 60b of the third latch circuit 60, which is commonly connected to the input terminals 8a and 10a of the second and third inverter circuits 8 and 10.

The third latch circuit 60 receives the output signal of the fourth inverter circuit 12 at the input terminal 60a. Then, the circuit 60 latches a signal having the opposite logic level to the output signal of the circuit 12 so as to be synchronized with the clocked signal CLK and the inverted clocked signal CLK'. Then, the circuit 60 supplies a signal having the opposite logic level to the latched signal (i.e., a signal having the same logic level as the output signal of the circuit 12) to the second and third inverter circuits 8 and 10.

When the clocked signal CLK is at the logic low level (i.e., the inverted clocked signal CLK' is at the logic high level), the MOSFETs 91 and 92 are turned off, stopping the supply of the output signal of the fourth inverter circuit 12 to the inverter circuit 81. At this time, the MOSFETs 93 and 94 are turned on and thus, the inverter circuits 81 and 82 form a positive feedback loop. Therefore, the signal having the opposite logic level to the output signal of the circuit 12 at the time just before the clocked signal CLK is turned to the logic low level (i.e., just before the inverted clocked signal CLK' is turned to the logic high level) is latched in the third latch circuit 60. The signal thus latched is then supplied to the second and third inverter circuits 8 and 10 through the inverter circuit 83.

On the other hand, when the clocked signal CLK is at the logic high level (i.e., the inverted clocked signal CLK' is at the logic low level), the MOSFETs 91 and 92 are turned on, supplying the output signal of the fourth inverter circuit 12 to the inverter circuit 81. At this time, the MOSFETs 93 and 94 are turned off and thus, the inverter circuits 81 and 82 do not form any positive feedback loop. Therefore, the output signal of the circuit 12 is supplied to the second and third inverter circuits 8 and 10 through the inverter circuits 81 and 83.

The clock signal CLK is applied as control signals to the p-channel MOSFET 40a of the first inverter circuit 6, the p-channel MOSFET 40b of the second inverter circuit 8, the n-channel MOSFET 48a of the first latch circuit 22, and the n-channel MOSFET 48b of the second latch circuit 24. The inverted clock signal CLK' is applied as control signals to the n-channel MOSFET 43a of the first inverter circuit 6, the n-channel MOSFET 43b of the second inverter circuit 8, the p-channel MOSFET 46a of the first latch circuit 22, and the p-channel MOSFET 46b of the second latch circuit 24.

Next, the operation of the address buffer circuit 2A according to the second embodiment of FIG. 6 will be explained while referring to FIG. 7.

As shown in FIG. 7, the address signal ADIN supplied to the address buffer circuit 2A is turned from the logic low level to the logic high level at the time T11 and then, returned from the logic high level to the logic low level at the time T11'.

On the other hand, the clocked signal CLK is turned from the logic high level to the logic low level at the time T11 and then, returned from the logic low level to the logic high level at the time T11'. Furthermore, the signal CLK is turned from the logic low level to the logic high level at the time T12 and then, returned from the logic high level to the logic low level at the time T12'.

The inverted clocked signal CLK' is turned from the logic high level to the logic low level at the time T11 and then, returned from the logic low level to the logic high level at the time T11'. The signal CLK' is turned from the logic high level to the logic low level at the time T12 and then, returned from the logic low level to the logic high level at the time T12'.

The period between the times T11' and T11 and the period between the times T12' and T12 are "address setup periods". The period between the times T11' and T12 and the period between the times T12' and T13 are "normal access periods".

If the address signal ADIN is turned from the logic high level to the logic low level at the time T11, the output signal of the input stage 4 is turned from the logic high level to the logic low level and at the same time, the output signal of the fourth inverter circuit 12 is turned from the logic low level to the logic high level.

At the time T11, in the third latch circuit 60, the p-channel MOSFET 91 and the n-channel MOSFET 92 are turned on while the p-channel MOSFET 93 and the n-channel MOSFET 94 are turned off by the clock signal CLK and the inverted clocked signal CLK'. Thus, the output signal of the fourth inverter circuit 12 is outputted to the output terminal 60b of the circuit 60 through the inverter circuits 81 and 83. Accordingly, the output signal of the third latch circuit 60 is turned from the logic low level to the logic high level. Due to this turning of the output signal of the third latch circuit 60, the output signal of the third inverter circuit 10 is turned from the logic high level to the logic low level.

At the time T11, in the first inverter circuit 6, the p-channel MOSFET 40a and the n-channel MOSFET 43a are turned off by the signals CLK and CLK', inactivating the first inverter circuit 6. Similarly, in the second inverter circuit 8, the p-channel MOSFET 40b and the n-channel MOSFET 43b are turned off at the time T11 by the signals CLK and CLK', inactivating the second inverter circuit 8. In this inactive state, due to the parasitic capacitance in the neighborhood of the gate of the p-channel MOSFETs 41a and 41b and that in the neighborhood of the gate of the n-channel MOSFETs 42a and 42b, unwanted signals having different logic levels each other are induced at the output terminals 6b and 8b of the first and the second inverter circuits 6 and 8.

At the time T13, in the equalization circuit 16, the p-channel MOSFET 34 and the n-channel MOSFET 36 are turned on, thereby interconnecting the output terminal 6b of the first inverter circuit 6 with the output terminal 8b of the second inverter circuit 8. As a result, the unwanted signals of the first and second inverter circuits 6 and 8 at the time T11 are equalized by way of the equalization circuit 16, resulting in the output signals S1 and S2 at the logic intermediate or medium level between the logic high and low levels.

At the subsequent time T11', if the clocked signal CLK is turned from the logic high level to the logic low level (i.e., the inverted clocked signal CLK' is turned from the logic low level to the logic high level), the p-channel MOSFET 91 and the n-channel MOSFET 92 are turned off while the p-channel MOSFET 93 and the n-channel MOSFET 94 are turned on in the third latch circuit 60. As a result, the input of the output signal of the fourth inverter circuit 12 into the inverter circuit 81 is stopped and at the same time, a positive feedback loop is formed by the inverter circuits 81 and 82. Accordingly, the output signal of the third latch circuit 60 is kept at the logic high level even after the time T11'.

The output signal of the third inverter circuit 10 is kept at the logic low level at the time T11'.

At the time T11', in the first inverter circuit 6, the p-channel MOSFET 40a and the n-channel MOSFET 42a are turned on by the signals CLK and CLK', activating the first inverter circuit 6. The activated first inverter circuit 6 is applied with the output signal of the third inverter circuit 10 having the logic low level. Similarly, in the second inverter circuit 8, the p-channel MOSFET 40b and the n-channel MOSFET 43b are turned on by the signals CLK and CLK' at the time T11', activating the second inverter circuit 8. The activated second inverter circuit 8 is applied with the output signal of the third latch circuit 60 having the logic high level.

At the time T11', the p-channel MOSFET 34 and the n-channel MOSFET 36 are turned off in the equalization circuit 16, separating or disconnecting the output terminal 6b of the first inverter circuit 6 from the output terminal 8b of the second inverter circuit 8. As a result, the output signal S1 of the first inverter circuit 6 is turned to the logic intermediate level to the logic high level and at the same time, the output signal of the second inverter circuit 6 is turned from the logic intermediate level to the logic low level.

At the subsequent time T12, if the clocked signal CLK is turned from the logic low level to the logic high level (i.e., the inverted clocked signal CLK' is turned from the logic high level to the logic low level), the p-channel MOSFET 91 and the n-channel MOSFET 92 are turned on while the p-channel MOSFET 93 and the n-channel MOSFET 94 are turned off in the third latch circuit 60. As a result, the output signal of the fourth inverter circuit 12 is outputted to the output terminal 60b of the circuit 60 by way of the inverter circuits 81 and 83. Accordingly, the output signal of the circuit 60 is turned from the logic high level to the logic low level.

According to the turning of the output signal of the third latch circuit 60, the output signal of the third inverter circuit 10 is turned from the logic low level to the logic high level.

At the time T12, in the first inverter circuit 6, the p-channel MOSFET 40a and the n-channel MOSFET 43a are turned off by the signals CLK and CLK', inactivating the circuit 6. Similarly, in the second inverter circuit 8, the p-channel MOSFET 40b and the n-channel MOSFET 43b are turned off at the time T12 by the signals CLK and CLK', inactivating the second inverter circuit 8.

At the time T12, in the equalization circuit 16, the p-channel MOSFET 34 and the n-channel MOSFET 36 are turned on by the signals CLK and CLK', thereby interconnecting the output terminal 6b of the first inverter circuit 6 with the output terminal of the second inverter circuit 8. Thus, similar to the case at the time T11, the output signals S1 and S2 of the first and second inverter circuits 6 and 8 are equalized to be at the logic intermediate or medium level between the logic high and low levels.

At the subsequent time T12', if the clocked signal CLK is turned from the logic high level to the logic low level (i.e., the inverted clocked signal CLK' is turned from the logic low level to the logic high level), the p-channel MOSFET 91 and the n-channel MOSFET 92 are turned off while the p-channel MOSFET 93 and the n-channel MOSFET 94 are turned on in the third latch circuit 60. As a result, the input of the output signal of the fourth inverter circuit 12 into the inverter circuit 81 is stopped and at the same time, a positive feedback loop is formed by the inverter circuits 81 and 82. Accordingly, the output signal of the third latch circuit 60 is kept at the logic low level even after the time T12'.

At the time T12', the output signal of the third inverter circuit 10 is kept at the logic high level.

At the time T12', in the first inverter circuit 6, the p-channel MOSFET 40a and the n-channel MOSFET 42a are turned on by the signals CLK and CLK', activating the first inverter circuit 6. The circuit 6 thus activated is supplied with the output signal of the third inverter circuit 10 having the logic low level. Similarly, in the second inverter circuit 8, the p-channel MOSFET 40b and the n-channel MOSFET 43b are turned on by the signals CLK and CLK', activating the second inverter circuit 8. The circuit 8 thus activated is supplied with the output signal of the third latch circuit 60 having the logic high level.

At the time T12', in the equalization circuit 16, the p-channel MOSFET 34 and the n-channel MOSFET are turned off, separating or disconnecting the output terminal 6b of the first inverter circuit 6 from the output terminal 8b of the second inverter circuit 8. As a result, the output signal S1 of the first inverter circuit 6 is turned from the logic intermediate level to the logic low level and at the same time, the output signal S2 of the second inverter circuit 6 is turned from the logic intermediate level to the logic high level.

The first and the second latch circuits 22 and 24 operate in approximately the same way as the address buffer circuit 2 according to the first embodiment of FIG. 3. Therefore, no detailed description on the circuits 22 and 24 is presented here.

As described above, with the address buffer circuit 2A according to the second embodiment of FIG. 6, similar to the address buffer circuit 2 according to the first embodiment of FIG. 3, each of the output signals S1 and S2 of the first and the second inverter circuits 6 and 8 is turned from its logic intermediate or medium level to the logic high or low level. Thus, the fluctuation of the supply current and the ground current are reduced, thereby suppressing the fluctuation of the supply voltage $V_{cc}$ and the ground voltage. Accordingly, unstable operation and malfunction of other circuits that use commonly the power supply line and the ground line for the first and the second inverter circuits 6 and 8 can be prevented.

Furthermore, since the clocked signal CLK and the inverted clocked signal CLK' supplied from the outside of the address buffer circuit 2A are used, the fifth inverter circuit 14 for generating the inverted data latch signal DTL' from the data latch signal DTL is unnecessary, which is unlike the address buffer circuit 2 according to the first embodiment. Accordingly, there is an additional advantage that the additional circuit or circuits to be added can be smaller in circuit scale than the circuit 2 of the first embodiment.

In the above-described first and second embodiments, the invention is applied to the address buffer circuit for the semiconductor memory device. However, it is needless to say that the invention is applicable to any other type of buffer circuits.

While the preferred forms of the present invention have been described, it is to be understood that modifications will be apparent to those skilled in the art without departing from the spirit of the invention. The scope of the present invention, therefore, is to be determined solely by the following claims.

What is claimed is:

1. A buffer circuit comprising:
   (a) a first inverter circuit including a first MOSFET having a channel of a first conductivity type and a second MOSFET having a channel of a second conductivity type opposite to the first conductivity type;
      a gate of said first MOSFET and a gate of said second MOSFET being coupled together, forming an input terminal of said first inverter circuit;
      a first input signal at a first logic state being applied to the input terminal of said first inverter circuit;
      one end of the channel of said first MOSFET and one end of the channel of said second MOSFET being coupled together, forming an output terminal of said first inverter circuit;
   (b) a second inverter circuit including a third MOSFET having a channel of the first conductivity type and a fourth MOSFET having a channel of the second conductivity type;
      a gate of said third MOSFET and a gate of said fourth MOSFET being coupled together, forming an input terminal of said second inverter circuit;

a second input signal at a second logic state opposite to the first logic state being applied to the input terminal of said second inverter circuit;

one end of the channel of said third MOSFET and one end of the channel of said fourth MOSFET being coupled together, forming an output terminal of said second inverter circuit;

(c) an equalization circuit for equalizing the first output signal of said first inverter circuit and the second output signal of said second inverter circuit to each other;

said equalization circuit including a fifth MOSFET having a channel of the first conductivity type and a sixth MOSFET having a channel of the second conductivity type;

one end of the channel of said fifth MOSFET and one end of the channel of said sixth MOSFET being coupled together to be connected to the output terminal of said first inverter circuit;

the other end of the channel of said fifth MOSFET and the other end of the channel of said sixth MOSFET being coupled together to be connected to the output terminal of said second inverter circuit;

gates of said fifth and sixth MOSFETs being respectively applied with control signals at opposite logic levels, thereby setting said equalization circuit in a high-impedance state or a low-impedance state;

(d) a first switching circuit for connecting the other end of the channel of said first MOSFET to a first voltage line or disconnecting it from the first voltage line;

said first switching circuit including a seventh MOSFET having a channel of the first conductivity type;

one end of the channel of said seventh MOSFET being connected to the other end of the channel of said first MOSFET;

said first switching circuit being switched by a control signal applied to a gate of said seventh MOSFET;

(e) a second switching circuit for connecting the other end of the channel of said second MOSFET to a second voltage line or disconnecting it from the second voltage line;

said second switching circuit including an eighth MOSFET having a channel of the second conductivity type;

one end of the channel of said eighth MOSFET being connected to the other end of the channel of said second MOSFET;

said second switching circuit being switched by a control signal applied to a gate of said eighth MOSFET;

(f) a third switching circuit for connecting the other end of the channel of said third MOSFET to the first voltage line or disconnecting it from the first voltage line;

said third switching circuit including a ninth MOSFET having a channel of the first conductivity type;

one end of the channel of said ninth MOSFET being connected to the other end of the channel of said third MOSFET;

said third switching circuit being switched by a control signal applied to a gate of said ninth MOSFET;

(g) a fourth switching circuit for connecting the other end of the channel of said fourth MOSFET to the second voltage line or disconnecting it from the second voltage line;

said fourth switching circuit including a tenth MOSFET having a channel of the second conductivity type;

one end of the channel of said tenth MOSFET being connected to the other end of the channel of said fourth MOSFET;

said fourth switching circuit being switched by a control signal applied to a gate of said tenth MOSFET;

(h) said equalization circuit being set in the high-impedance state, when said first switching circuit connects the other end of the channel of said first MOSFET to the first voltage line, said second switching circuit connects the other end of the channel of said second MOSFET to the second voltage line, said third switching circuit connects the other end of the channel of said third MOSFET to the first voltage line, and said fourth switching circuit connects the other end of the channel of said fourth MOSFET to the second voltage line;

said first inverter circuit generating a first output signal in the second logic state at its output terminal and said second inverter circuit generating a second output signal in the first logic state at its output terminal; and (i) said equalization circuit being set in the low-impedance state, when said first switching circuit disconnects the other end of the channel of said first MOSFET from the first voltage line, said second switching circuit disconnects the other end of the channel of said second MOSFET from the second voltage line, said third switching circuit disconnects the other end of the channel of said third MOSFET from the first voltage line, and said fourth switching circuit disconnects the other end of the channel of said fourth MOSFET from the second voltage line;

the output terminals of said first and second inverter circuits being connected to each other by way of said equalization circuit, resulting in the first and second output signals of said first and second inverter circuits being in an approximately medium logic state between the first and second logic states.

2. The circuit according to claim 1, further comprising:

a first latch circuit for latching the output signal of said first inverter circuit generated at its output terminal when said equalization circuit is in the low-impedance state; and a second latch circuit for latching the output signal of said second inverter circuit generated at its output terminal when said equalization circuit is in the low-impedance state.

3. The circuit according to claim 1, wherein the first input signal applied to the input terminal of said first inverter circuit is an address signal supplied to a memory section of a semiconductor memory device;

and wherein the second input signal applied to the input terminal of said second inverter circuit is an inverted one of the address signal.

4. The circuit according to claim 3, wherein the control signals at the opposite logic levels applied to the gates of said fifth and sixth MOSFETs of said equalization circuit are pulsed signals formed to be synchronized with transition of the address signal;

and wherein the control signal applied to each of said first to fourth switching circuits is a pulsed signal formed to be synchronized with transition of the address signal.

5. The circuit according to claim 4, wherein the pulsed signals for said equalization circuit and the pulsed signal for each of said first to fourth switching circuits are produced by a data latch signal;

the data latch signal being generated by an output signal of an address transition detection circuit.

6. The circuit according to claim 4, further comprising:

a latch circuit for latching the first input signal applied to said first inverter circuit prior to application to said first inverter circuit.

7. The circuit according to claim 4, wherein the pulsed signals for said equalization circuit and the pulsed signal for each of said first to fourth switching circuits are produced by a clock signal supplied to said semiconductor memory device.

* * * * *